United States Patent [19]

Tran et al.

[11] Patent Number: 5,766,369
[45] Date of Patent: Jun. 16, 1998

[54] METHOD TO REDUCE PARTICULATES IN DEVICE MANUFACTURE

[75] Inventors: Toan Tran, Mesquite; Michael F. Brenner, Dallas, both of Tex.

[73] Assignee: Texas Instruments Incorporated, Dallas, Tex.

[21] Appl. No.: 726,181

[22] Filed: Oct. 4, 1996

Related U.S. Application Data

[60] Provisional application No. 60/004,836 Oct. 5, 1995.
[51] Int. Cl.⁶ ................................................ B08B 7/02
[52] U.S. Cl. .................... 134/1.3; 134/1; 134/6; 134/32
[58] Field of Search ................... 134/1, 1.1, 1.2, 134/1.3, 2, 6, 7, 32, 40

[56] References Cited

U.S. PATENT DOCUMENTS 3,765,941  10/1973  Gordon ............................. 134/42
4,111,546   9/1978  Maret ................................ 134/1
5,427,644   6/1995  Nagatsuka et al. ............... 156/344

OTHER PUBLICATIONS

Handbook of Semiconductor Wafer Cleaning Technology, Werner Kern editor, Noyes publications, 1993.

*Primary Examiner*—Jill Warden
*Assistant Examiner*—Alexander Markoff
*Attorney, Agent, or Firm*—Julie L. Reed; James C. Kesterson; Richard L. Donaldson

[57] ABSTRACT

An improved process for manufacturing semiconductor devices (10). The device, which could be a semiconductor wafer, an individual chip, or a device that has integrated within it semiconductor devices, such as a compact disk drive, is placed or held upside down with its working surface (12) open. The device (10) is struck, causing particulates (18) attached to the working surface (12) to fall free of the device. Alternately, the device could be sharply decelerated to apply the shock. Additionally, the device could be held substantially vertical and rotated to use centrifugal force to separate the particulates away from the device.

10 Claims, 1 Drawing Sheet

METHOD TO REDUCE PARTICULATES IN DEVICE MANUFACTURE

This application claims priority under 35 U.S.C. § 119 (e) (1) of provisional application No. 60/004,836 filed Oct. 5, 1995.

BACKGROUND OF THE INVENTION

1. Field of the Invention

This invention relates to semiconductor processing, more particularly to removing particulates from semiconductor devices.

2. Background of the Invention

Particulate contamination remains a prevalent problem in semiconductor device manufacture. Devices such as micromechanical machines, compact disk drives and computer hard drives are examples of devices with special sensitivity to particulates, both electrically and mechanically. Particulate contamination can cause failures such as shorting, where the particle makes connection between two traces or lines on the device causing an electrical short, in almost all semiconductor devices. The devices listed above also have mechanical problems because of particulate contamination.

Devices such as micromechanical machines have moving parts which can become stuck because of particles, or can fail to make either electrical or mechanical connections because of the particles. These devices are typically cleaned of contaminating particles by very gentle and delicate cleaning processes, such as wet rinses. Because of their moving parts, especially in the case of micromechanical devices, where the moving parts are literally micrometers in thickness, the cleaning process can be relatively long and painstaking to avoid injury to the parts.

SUMMARY OF THE INVENTION

An improved method for manufacture of semiconductor devices, which includes wafers, individual chips, and devices that integrate semiconductor devices into their structure, such as hard and compact disk drives. In one embodiment, the device is turned upside down with its working surface open. In an alternate embodiment, the device is held substantially vertical and rotated to allow the centrifugal rotation to separate the particles away from the device. In yet another alternative, the device is subjected to a vibrational or mechanical shock to cause particles to fall away from the device.

It is an advantage of the invention that it reduces particulate contamination on the working surfaces of semiconductor devices.

It is a further advantage of the invention that it can release stuck moving parts of micromechanical devices.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE PREFERRED EMBODIMENTS

The manufacturing process involving semiconductor devices usually involves very careful handling of the wafers and the resulting chips; from the wafer processing to the packaging. This is especially true when the semiconductor devices will be exposed to particulates as part of a manufacturing process that involves additional steps or parts before the entire device is packaged. Example of these types of devices include micromechanical machines, compact disk and hard disk drives. For ease of reference all of these devices, wafers, micromachines, compact and hard disk drives, etc. will be referred to as semiconductor devices.

For discussion purposes only, focus will center on micromechanical devices because of their high sensitivity to rough handling and particulate contamination. The manufacturing process for micromechanical devices, such as micromotors, microgears and even micromirrors (the digital micromirror device, DMD, is manufactured by Texas Instruments) typically involves several steps. Initial processing is performed on a wafer in order to manufacture the addressing or activation circuitry for the devices. At that point, either the devices themselves can be built on the wafer or the wafer could be diced and the devices formed on the individual chips from the wafer. Either way, the process will reach a point where the devices are complete in an array or series, with only the packaging to be completed.

As an example, the digital micromirror device is produced through a series of steps of depositing metal layers upon layers of resist, then etching the resist away to leave free moving mirrors supported by metal posts above the substrate. The final step in this case would be to package the device under a glass window. At every step in the process, but especially after the mirrors are freed, the utmost care must be taken not to jar the device or apply any force that can break the minuscule posts or cause the mirrors to stick.

One problem, in addition to the electrical and mechanical problems caused by particles, DMDs also suffer from stuck mirrors. The mirrors may stick to the landing electrodes before the device is ever activated. One advantage of this invention is that is allows not only the reduction of particles, but it can unstick the mirrors.

Figure 1:
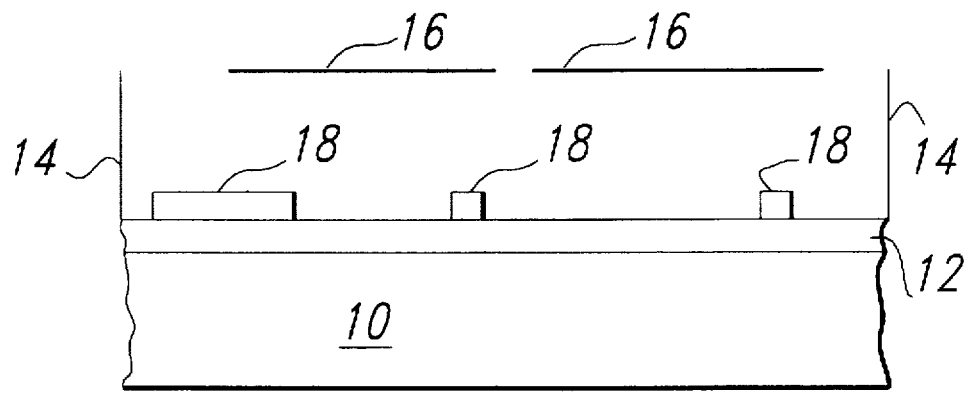
FIG. 1 shows a schematic diagram of a semiconductor device with particulate contamination.

FIG. 1 shows a micromechanical device 10 which includes a substrate 12, some type of support structure 14 and free moving parts 16. The device has particulate matter 18 on the surface of the substrate or activation circuitry, referred to as the working surface, which may prevent proper operation of the device.

Figure 2:
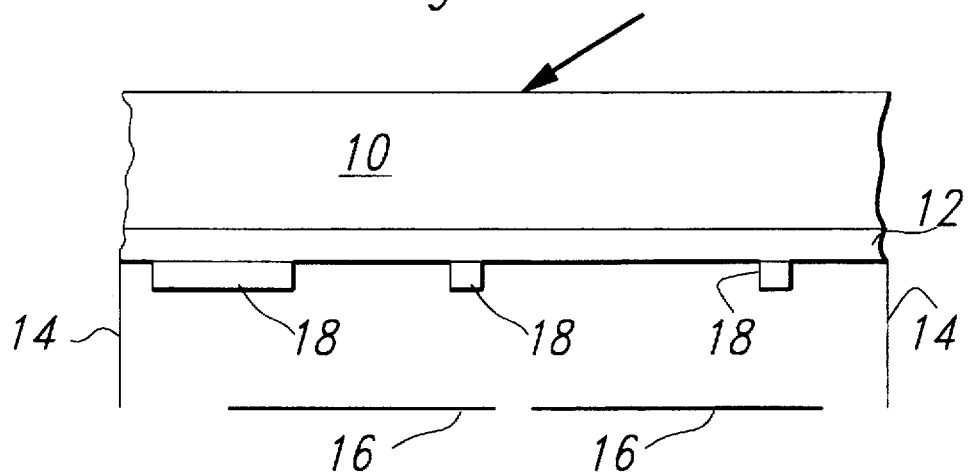
FIG. 2 shows one method for eliminating particulate matter from a semiconductor device.

FIG. 2 shows one embodiment of the invention. The device 10 of FIG. 1 is turned upside down and struck in the area indicated by arrow 20. This will free the particles 18 and cause them to fall out of the device. This step may be done at any point deemed suitable by the process designer, provided it is before the device is packaged and sealed. The particulate matter must be allowed to fall completely away from the device, so the working surface must be open to allow the particles to fall. The shock could be delivered to either the backside or the side of the device.

One advantage of this process occurs uniquely in micromechanical devices. When the wafer or chip is struck, moving parts that have become stuck can be freed and regain their mobility. In testing this process on digital micromirror devices the following results were obtained.

TABLE 1

| | Device Particle Count Reduction | | | |
|---|---|---|---|---|
| Device # | Initial particle count | After 1st strike | After 2nd strike | After 3rd strike |
| 1 | 8 | 5 | 3 | 3* |
| 2 | 3 | 0 | 0 | 0 |
| 3 | 6 | 0 | 0 | 0 |

*These particles were found to have been welded onto the working surface.

Additionally, when a device that had over 400,000 stuck mirrors (out of approximately 2,000,000) was struck once, all stuck mirror released.

Alternately, the shock could be vibrational rather than mechanical. The shocks could be caused by a striker, vibrator, acoustic device, hydraulic device or any other means of applying a vibrational or mechanical shock. The selection of the delivery method should be premised upon automating the process, thereby not interfering with the device manufacture flow.

In some cases, it will not be necessary to shock the device. It may only be necessary to include an inverting step in the process flow. By turning the device upside down with the working surface clear, particulates may fall free without the impetus provided by the shock. Additionally, the mechanical shock could be achieved by causing the device to decelerate sharply, as if the device were dropped.

In another embodiment, the device could be turned such that it was substantially vertical. By rotating the device quickly, centrifugal forces will separate the particles away from the device.

It should be noted that all embodiments of this process use a step that was previously thought to be improbable when handling semiconductor wafers or devices, that is applying hard force to the backside or edge of the device, or spinning the device rapidly. The shock can be delivered by a hammer, or it could be automated such that the devices are inserted into carriers, inverted and struck with an acoustic pulse or a mechanical one as part of their processing flow. The results above were obtained using a 55 gm hammer.

Thus, although there has been described to this point particular embodiments of a process for further reducing particulate contamination in semiconductor devices, it is not intended that such specific references be considered as limitations upon the scope of this invention except in-so-far as set forth in the following claims.

What is claimed is:

1. An improved process for manufacture of semiconductor devices having a substrate with a top side upon which are micromechanical devices, including the steps of:

holding said device with said top side facing down;

applying a shock to said device, such that particulates on said top side of said substrate underneath said micromechanical devices fall free of said device.

2. The method of claim 1 wherein said shock is a mechanical shock delivered to the backside or edge of said device.

3. The method of claim 2 wherein said mechanical shock is applied by a striker.

4. The method of claim 2 wherein said mechanical shock is applied by an acoustic device.

5. The method of claim 2 wherein said mechanical shock is applied by an hydraulic device.

6. The method of claim 2 wherein said mechanical shock is applied by causing said device to decelerate sharply.

7. The method of claim 1 wherein said shock is a vibrational shock applied to said device.

8. The method of claim 7 wherein said vibrational shock is applied by a vibrator.

9. The method of claim 7 wherein said vibrational shock is applied by an acoustic device.

10. The method of claim 1 wherein said device is a compact disk drive.

* * * * *